United States Patent
Guo et al.

(10) Patent No.: US 12,495,667 B2
(45) Date of Patent: Dec. 9, 2025

(54) NANOMATERIAL, PREPARATION METHOD THEREOF, AND QUANTUM DOT LIGHT-EMITTING DIODE

(71) Applicant: TCL TECHNOLOGY GROUP CORPORATION, Huizhou (CN)

(72) Inventors: Yulin Guo, Huizhou (CN); Longjia Wu, Huizhou (CN); Tianshuo Zhang, Huizhou (CN); Junjie Li, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 626 days.

(21) Appl. No.: 17/995,852

(22) PCT Filed: Dec. 22, 2021

(86) PCT No.: PCT/CN2021/140528
§ 371 (c)(1),
(2) Date: Oct. 8, 2022

(87) PCT Pub. No.: WO2022/143345
PCT Pub. Date: Jul. 7, 2022

(65) Prior Publication Data
US 2023/0157045 A1 May 18, 2023

(30) Foreign Application Priority Data
Dec. 28, 2020 (CN) .......................... 202011588908.0

(51) Int. Cl.
*H10K 50/16* (2023.01)
*B82Y 30/00* (2011.01)
(Continued)

(52) U.S. Cl.
CPC .............. *H10K 50/16* (2023.02); *B82Y 30/00* (2013.01); *B82Y 40/00* (2013.01); *C09K 11/58* (2013.01);
(Continued)

(58) Field of Classification Search
CPC ................................ H10K 50/16; C09K 11/58
See application file for complete search history.

(56) References Cited

U.S. PATENT DOCUMENTS

2012/0138894 A1   6/2012   Qian et al.

FOREIGN PATENT DOCUMENTS

| CN | 101485977 A | 7/2009 |
| CN | 103706350 A | 4/2014 |

(Continued)

OTHER PUBLICATIONS

Huang. Enhanced gas-sensing performance of ZnO@In2O3 core@shell nanofibers prepared by coaxial electrospinning. Sensors and Actuators B: Chemical vol. 255, Part 2, Feb. 2018, pp. 2248-2257 (Year: 2018).*

(Continued)

*Primary Examiner* — Matthew E. Hoban
(74) *Attorney, Agent, or Firm* — ANOVA LAW GROUP, PLLC

(57) ABSTRACT

The present disclosure relates to a nanomaterial, a light-emitting diode device, and a preparation method thereof. The nanomaterial includes a ZnO nanoparticle and an $In_2O_3$ shell layer covering a surface of the ZnO nanoparticle. In the present disclosure, the $In_2O_3$ shell layer are coated on the surface of the ZnO nanoparticle to form a ZnO@ $In_2O_3$ core shell structure, that is, prepare the nanomaterial. In the present disclosure, $In_2O_3$ having a wide bandgap is used as a shell layer to cover a semiconductor ZnO nanoparticle having a relatively narrow bandgap, which can effectively (Continued)

passivate the surface of the ZnO nanoparticle to reduce the surface defects and relieve lattice mismatch. Meanwhile, holes may be effectively blocked from being transported from a light-emitting layer to a cathode to improve the recombination efficiency of electrons and holes on the light-emitting layer. Thus, the light-emitting performance of the light-emitting device may be improved.

18 Claims, 3 Drawing Sheets

(51) Int. Cl.
- *B82Y 40/00* (2011.01)
- *C09K 11/58* (2006.01)
- *C09K 11/62* (2006.01)
- *C09K 11/88* (2006.01)
- *H10K 50/115* (2023.01)
- *H10K 71/00* (2023.01)
- *H10K 102/00* (2023.01)

(52) U.S. Cl.
CPC .......... *C09K 11/623* (2013.01); *C09K 11/881* (2013.01); *C09K 11/883* (2013.01); *H10K 50/115* (2023.02); *H10K 50/166* (2023.02); *H10K 71/00* (2023.02); *H10K 2102/351* (2023.02)

(56) References Cited

FOREIGN PATENT DOCUMENTS

| | | | |
|---|---|---|---|
| CN | 107890863 | A | 4/2018 |
| CN | 110838560 | A | 2/2020 |
| CN | 112058252 | A | 12/2020 |
| CN | 112058253 | * | 12/2020 |
| CN | 112058253 | A | 12/2020 |
| KR | 20160057710 | A | 5/2016 |

OTHER PUBLICATIONS

The World Intellectual Property Organization (WIPO) International Search Report for PCT/CN2021/140528 Mar. 8, 2022 6 Pages.
Bin Liu, et al., "The Influence of Concentration of Hydrochloric Acid on the Structure of Porous Hollow Rod Indium Oxide", Journal of Gansu Sciences, 2016, 28,(2): 20-23.

* cited by examiner

NANOMATERIAL, PREPARATION METHOD THEREOF, AND QUANTUM DOT LIGHT-EMITTING DIODE

CROSS-REFERENCES TO RELATED APPLICATIONS

This application is a national phase entry under 35 U.S.C. § 371 of International Application No. PCT/CN2021/140528, filed on Dec. 22, 2021, which claims priority to Chinese Application No. 202011588908.0 filed on Dec. 28, 2020, the entire content of all of which are incorporated herein by reference.

TECHNICAL FIELD

The present disclosure generally relates to the quantum dot technology field and, more particularly, to a nanomaterial, a light-emitting diode device, and a preparation method of the light-emitting diode device.

BACKGROUND

ZnO is a direct bandgap n-type semiconductor material with a wide band gap of 3.37 eV and a low work function of 3.7 eV and has advantages of good stability, high transparency, safety, and non-toxicity, which makes ZnO a suitable electron transport layer material. ZnO has many potential advantages. First, exciton binding energy of ZnO achieves as high as 60 meV, which is much higher than other wide-bandgap semiconductor materials (25 meV for GaN) and 2.3 times higher than room temperature thermal energy (26 meV). Thus, excitons of ZnO are stable at room temperature. Second, ZnO has a hexagonal wurtzite structure and exhibits strong spontaneous polarization. In a ZnO-based heterostructure, the strain of the material can lead to extremely strong piezoelectric polarization, which in turn leads to the generation of polarization effect in the ZnO-based heterostructure. In a polarization electric field generated by the polarization, interfacial polarization charges with high concentration are induced on a ZnO heterojunction surface, thereby regulating the energy band of the material to further affect the related structure and device performance.

However, when ZnO nanoparticles are used as the electron transport layer, a surface defect of ZnO such as hydroxyl and oxygen vacancies inevitably leads to degradation of the device performance.

Therefore, the existing technology still needs to be improved and developed.

SUMMARY

In view of the above-mentioned deficiencies of the prior art, the purpose of the present disclosure is to provide a nanomaterial, a light-emitting diode device, and a preparation method thereof to solve the problem that the performance of the light-emitting diode device is reduced by using the ZnO nanoparticle as the electron transport layer due to the existence of many defects on the surface of the existing ZnO nanoparticle.

The technical solutions of the present disclosure are as follows.

A nanomaterial includes a ZnO nanoparticle and an $In_2O_3$ shell layer covering a surface of the ZnO nanoparticle.

A preparation method of a nanomaterial includes:
providing a ZnO nanoparticle; and
depositing an $In_2O_3$ shell layer on a surface of the ZnO nanoparticle to prepare the nanomaterial.

A preparation method of a light-emitting diode includes:
preparing an electron transport layer on a cathode, a material of the electron transport layer being a nanomaterial, and the nanomaterial including a ZnO nanoparticle and an $In_2O_3$ shell layer covering a surface of the ZnO nanoparticle;
preparing a light-emitting layer on the electron transport layer; and
preparing an anode on the light-emitting layer to prepare the light-emitting diode; or
preparing the light-emitting layer on the anode;
preparing the electron transport layer on the light-emitting layer, the material of the electron transport layer being the nanomaterial, and the nanomaterial including the ZnO nanoparticle and the $In_2O_3$ shell layer covering the surface of the ZnO nanoparticle; and preparing the cathode on the electron transport layer to prepare the light-emitting diode.

A light-emitting diode device includes a cathode, an anode, a light-emitting layer arranged between the cathode and the anode, and an electron transport layer arranged between the cathode and the light-emitting layer, a material of the electron transport layer being the nanomaterial prepared by the preparation method of embodiments of the present disclosure.

Beneficial effects include that in the present disclosure, a ZnO@ $In_2O_3$ core-shell structure is formed by coating the surface of the ZnO nanoparticle with the $In_2O_3$ shell layer. That is, the nanomaterial is prepared. In the present disclosure, $In_2O_3$ having a wide bandgap is used as the shell layer to cover the semiconductor ZnO nanoparticle that has the relatively narrow bandgap, which can effectively passivate the surface of the ZnO nanoparticle, reduce the surface defects, and alleviate the lattice mismatch. Meanwhile, the holes may be effectively blocked from being transferred from the light-emitting layer to the cathode to improve the recombination efficiency of the electrons and holes in the light-emitting layer and improve the light-emitting performance of the light-emitting device.

DETAILED DESCRIPTION OF THE EMBODIMENTS

Figure 1:
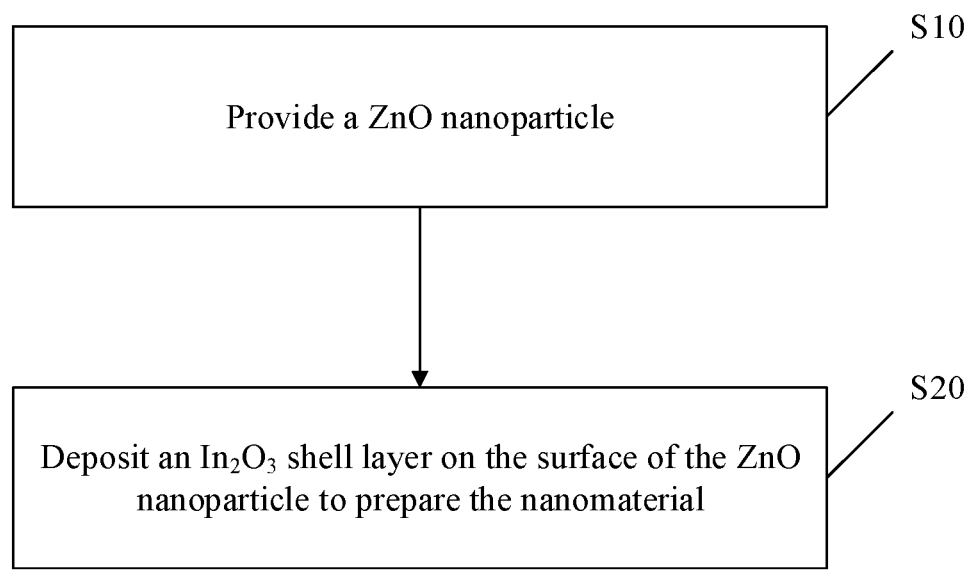
FIG. 1 is a first schematic flowchart of a preparation method of a nanomaterial according to some embodiments of the present disclosure.

The present disclosure provides a nanomaterial, a light-emitting diode device, and a preparation method thereof. In order to make the purposes, technical solutions, and effects of the present disclosure clearer and more specific, the present disclosure is further described in detail below. It should be understood that specific embodiments described here are only used to explain the present disclosure, but not to limit the present disclosure.

It should be noted that expressions such as "one or more" and "at least one" involved in the present disclosure may indicate one or more of the listed items, and "a plurality of" may indicate two or more than two of these items, including any combination of a single item (type) or a plurality of items (types). For example, "at least one of methanol, ethanol, and ethylene glycol" may refer to methanol, ethanol, ethylene glycol, methanol+ethanol, methanol+ethylene glycol, ethanol+ethylene glycol, or methanol+ethanol+ethylene glycol.

ZnO is a direct bandgap n-type semiconductor material with a wide band gap of 3.37 eV and a low work function of 3.7 eV and has advantages of good stability, high transparency, safety, and non-toxicity, which makes ZnO a suitable electron transport layer material. However, when ZnO nanoparticles are used as the electron transport layer, surface defects of ZnO such as hydroxyl and oxygen vacancies may inevitably lead to the degradation of the device performance.

Based on this, embodiments of the present disclosure provide a nanomaterial, including a ZnO nanoparticle and an $In_2O_3$ shell layer coated on a surface of the ZnO nanoparticle.

Similar to ZnO, $In_2O_3$ is a semiconductor with a wider band gap than ZnO (3.55-3.75 eV). In some embodiments, the ZnO nanoparticle may be used as the core, and $In_2O_3$ may be coated over the surface of the ZnO nanoparticle as a shell layer. The $In_2O_3$ shell layer can be effectively configured to passivate the surface of the ZnO nanoparticle, reduce the surface defects, and alleviate lattice mismatch, and also effectively block a hole from being transferred from the light-emitting layer to a cathode, which improves recombination efficiency of electrons and holes in the light-emitting layer, thereby improving the light-emitting performance of the light-emitting device.

In some embodiments, the nanomaterial further includes Au atoms or Au microclusters carried by the $In_2O_3$ shell layer. In some embodiments, due to an electronegativity difference between the $In_2O_3$ shell layer and the Au atoms or Au microclusters, the $In_2O_3$ shell layer may be adsorbed with the Au atoms or Au microclusters together through electrostatic interaction. In some embodiments, an Au microcluster may refer to an aggregate formed by several Au atoms or Au molecules. Properties may be close to a single Au atom. An atomic-level dispersion may greatly improve the utilization of Au atoms and reduce use of a precious metal. Au atoms or Au microclusters may form a contact interface on the $In_2O_3$ material, which may form an $Au^{\delta+}$—$In_2O_{3-x}$ interface after activation. $Au^{\delta+}$ may be an Au atom with positive charges (or partially delocalized Au ions). The Au atom may have a large specific surface area and interact with the In atom of neighboring coordinated In atoms, which causes charge redistribution around the In atom, thereby causing charge redistribution to build a new electron transport path to improve electron transport properties.

In some embodiments, a preparation method of the nanomaterial is also provided. As shown in FIG. 1, the method includes:

at S10, providing a ZnO nanoparticle; and at S20, depositing an $In_2O_3$ shell layer on the surface of the ZnO nanoparticle to prepare the nanomaterial.

In some embodiments, the ZnO nanoparticle can be prepared in a solution method. The preparation method may be relatively simple, have strong versatility, and be suitable for large-scale preparation. The $In_2O_3$ shell layer may be deposited on the surface of the ZnO nanoparticle in a chemical co-deposition method, which has a simple preparation process, low cost, and controllable condition. In the embodiment, the $In_2O_3$ shell lay may be prepared on the surface of the ZnO nanoparticle, and the $In_2O_3$ shell layer may effectively passivate the surface of the ZnO nanoparticle, reduce the surface defects, alleviate the lattice mismatch, and at the same time also effectively block the hole from being transported from the light-emitting layer to the cathode, which improves the recombination efficiency of the electrons and holes in the light-emitting layer to improve the light-emitting performance of the light-emitting device.

In some embodiments, the preparation of the ZnO nanoparticles includes dissolving a zinc salt in an organic solvent to obtain a zinc salt solution, adding alkali solution to the zinc salt solution and stirring to obtain a ZnO nanoparticle solution, performing precipitation and drying on the ZnO nanoparticle solution to prepare the ZnO nanoparticle.

In some embodiments, the preparation method of the ZnO nanoparticle is the solution method. The preparation method is relatively simple, has strong versatility, and is suitable for large-scale preparation. The zinc salt may be one or more of zinc chloride, zinc nitrate, or zinc acetate, which is not limited to this. The organic solvent may be one or both of dimethyl formamide (DMF) and dimethyl sulfoxide (DMSO), which is not limited to this. The alkali solution may be one or more of sodium hydroxide, potassium hydroxide, tetramethylammonium hydroxide, or ammonia water, which is not limited to this.

In some embodiments, the concentration of the zinc salt solution may range from 0.1 to 1 M. The concentration of the alkali solution may range from 0.1 to 1 M. A molar ratio of the hydroxide ions of the alkali solution and the molar ratio of the zinc ions may be (1.5 to 3.0):1. When the molar ratio of hydroxide ions and zinc ions is less than 1.5:1, the metal salt is excessive. When the molar ratio of hydroxide ions and zinc ions is greater than 3:1, a pH value may be too high, which will slow down the reaction speed of the system. Optimally, when the molar ratio of the hydroxide ions and the zinc ions is maintained at (1.5-3.0):1, a pH of 12 to 14 can be achieved, and eventually causes the particles to be evenly distributed at the subsequently obtained film.

In some embodiments, depositing the $In_2O_3$ shell layer on the surface of the ZnO nanoparticle may include dissolving an indium salt in an organic solvent to obtain an indium salt solution, dissolving the ZnO nanoparticles in organic alcohol to obtain the ZnO nanoparticle alcohol solution, adding the ZnO nanoparticle alcohol solution to the indium salt solution, then adding the alkali solution and stirring, reacting to obtain a ZnO nanoparticle solution covered by the $In_2O_3$ shell layer, and performing precipitation and drying on the ZnO nanoparticle solution covered with the $In_2O_3$ shell layer to obtain the ZnO nanoparticles coated by the $In_2O_3$ shell layer.

In some embodiments, the $In_2O_3$ shell layer on the surface of the ZnO nanoparticle may be deposited in a chemical co-deposition method. The preparation process may be simple and have a low cost and controllable condition. The indium salt may be one or more of indium nitrate, indium chloride, and indium acetate, which is not limited to this. The organic solvent may be one or more of methanol, ethanol, and isopropanol, which is not limited to this. The organic alcohol may include but is not limited to at least one of methanol, ethanol, and ethylene glycol. The alkali solution may be one or more of sodium hydroxide, potassium hydroxide, tetramethylammonium hydroxide and ammonia water species, but is not limited to this. In this embodiment, the concentration of the indium salt solution may range from 0.1 to 0.3M.

During the reaction, the pH value of the solution being too high or too low may have a significant influence on the purity and yield of the product. As an example, the reaction conditions may be maintained at pH 8 to 10.

Figure 2:
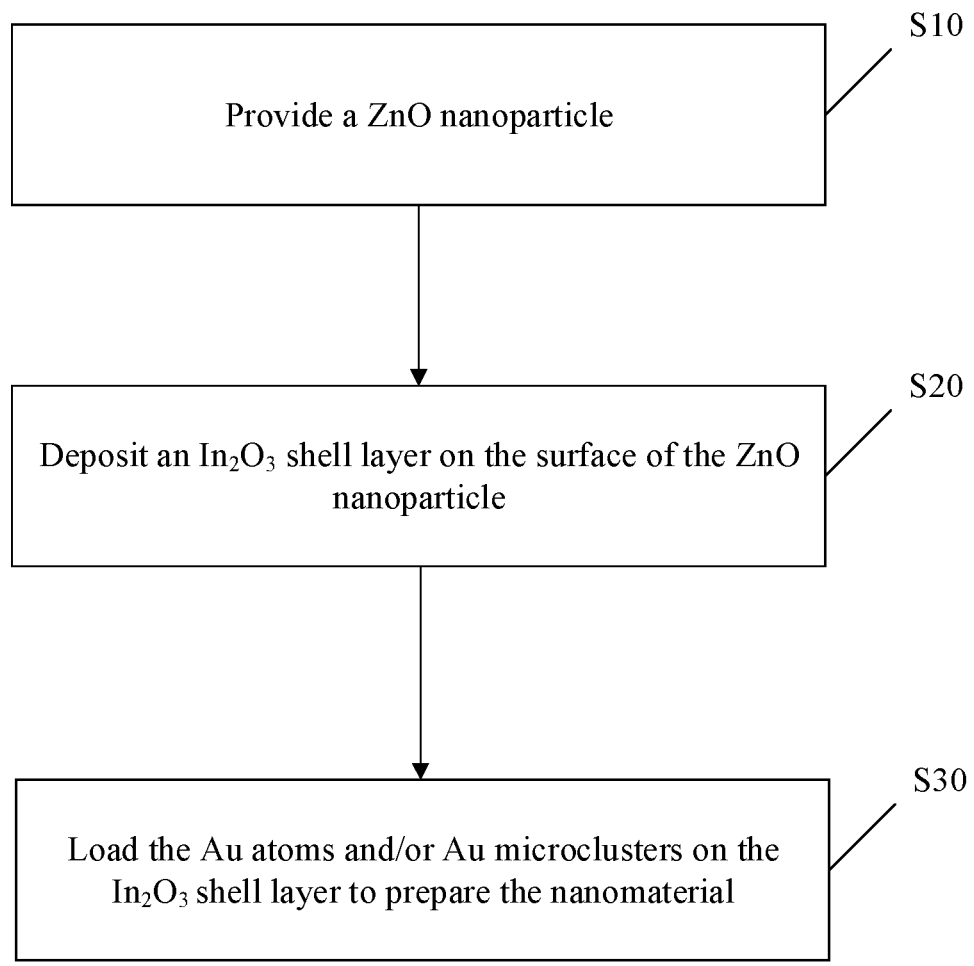
FIG. 2 is a second schematic flowchart of a preparation method of a nanomaterial according to some embodiments of the present disclosure.

In some embodiments, a preparation method of the nanomaterial may be also provided. As shown in FIG. 2, which includes:

at S10, providing the ZnO nanoparticle;

at S20, depositing an In2O3 shell layer on the surface of the ZnO nanoparticle; and at S30, loading the Au atoms and/or Au microclusters on the $In_2O_3$ shell layer to prepare the nanomaterial.

The ZnO nanoparticle covered by the $In_2O_3$ shell layer may be dissolved in the organic alcohol to obtain an $In_2O_3$ shell layer covered ZnO nanoparticle alcohol solution. Gold salt and the $In_2O_3$ shell layer covered ZnO nanoparticle alcohol solution may be added to a mixed solution composed of oleylamine and octadecene and stirred at 80 to 150° C. Au atoms and/or Au microclusters may be loaded on the $In_2O_3$ shell layer to prepare the nanomaterial.

In some embodiments, the octadecene can be used as a reducing agent to reduce the gold salt to Au atoms to be loaded on the $In_2O_3$ shell layer. The oleylamine can be used as a dispersant to inhibit excessive aggregation of Au atoms. In some embodiments, Au atoms and/or Au microclusters may be introduced on the $In_2O_3$ shell layer. The Au microclusters may refer to aggregates formed by several Au atoms or Au molecules and have properties close to a single Au atom. With atomic-level dispersion, a utilization rate of Au atoms may be greatly improved, which reduces use of a noble metal. Au atoms or Au microclusters may form a contact interface on the $In_2O_3$ material, and $Au^{\delta+}$—$In_2O_{3-x}$ interface may be formed after activation. $Au^{\delta+}$ may represent activated Au atoms with positive charges (or partially delocalized Au ions) on the interface. Au atoms may have a large specific surface area, which interacts with neighboring coordinated In atoms to cause a redistribution of charges around the In atoms to cause charge redistribution. Thus, a new electron transport path may be formed, and the electron transport performance may be improved.

In some embodiments, the gold salt may include but is not limited to one or more of chloroauric acid, ammonium tetrachloroaurate hydrate, or (triphenylphosphine) gold chloride. The organic alcohol may include but is not limited to at least one of methanol, ethanol, or ethylene glycol.

In a preparation method of the nanomaterial of embodiments of the present disclosure, ZnO nanoparticles may be synthesized in the solution method. Then, the $In_2O_3$ shell layer may be deposited on the surface of the ZnO nanoparticle in a chemical co-deposition method. Then, Au atoms or Au microclusters may be loaded on the $In_2O_3$ in a dipping method to prepare the nanomaterial. The preparation method of the present disclosure may be relatively simple and has strong versatility. Thus, the use of the precious metals may be reduced, and the method is suitable for large-scale preparation.

In some embodiments, a light-emitting diode device is also provided, which includes an electron transport layer. An electron transport layer material may be the nanomaterial described in the present disclosure or the nanomaterial prepared by the preparation method described in the present disclosure. As an example, the light-emitting diode device may be a QLED device or an OLED device.

A nanomaterial, a preparation method thereof, and a light-emitting diode of the present disclosure are further described in the following embodiments.

In embodiment 1 of the present disclosure, zinc chloride, sodium hydroxide, indium nitrate, and chloroauric acid are used as examples for a detailed introduction.

(1) Zinc chloride was added to DMF to form a solution with a total concentration of 0.5M. 0.6M NaOH ethanol solution was added dropwise at room temperature. Stirring was continued for 1.5 h to obtain a clear and transparent solution, which was precipitated with acetone and collected after centrifugation to obtain ZnO nanoparticles.

(2) The above-mentioned ZnO nanoparticles were dissolved and dispersed with an appropriate amount of ethanol to prepare a ZnO nanoparticle ethanol solution.

(3) Indium nitrate was added to ethanol to form a solution with a concentration of 0.2M. 30 mL of the above-mentioned ZnO nanoparticle ethanol solution was added. Then, an appropriate amount of NaOH was added to adjust the pH to 10. Stirring was performed at room temperature for 2 hours to obtain an $In_2O_3$ shell layer covered ZnO nanoparticle solution. After precipitation, $In_2O_3$ shell layer covered ZnO nanoparticles was obtained.

(4) The $In_2O_3$ shell layer covered ZnO nanoparticles were dispersed with an appropriate amount of ethanol to obtain an $In_2O_3$ shell layer covered ZnO nanoparticle ethanol solution.

(5) 20 mg of chloroauric acid and 30 mL of the above-mentioned $In_2O_3$ shell layer covered ZnO nanoparticle ethanol solution were added to 20 mL of the mixed solution of oleylamine and octadecene, dispersed by ultrasonic, and stirred at 120° C. for 1 h to obtain a mixed solution. Then, the solution was cooled to room temperature. The solids were collected by centrifugation to prepare the nanomaterial, which was washed with hexane and dispersed with an appropriate amount of ethanol for device preparation.

In embodiment 2 of the present disclosure, zinc nitrate hexahydrate, potassium hydroxide, indium nitrate, and chloroauric acid were used as examples for a detailed introduction.

(1) Zinc nitrate was added to DMF to form a solution with a total concentration of 0.5M. 0.6M KOH ethanol solution was dropwise added at room temperature. Stirring was continued for 1.5 h to obtain a clear and transparent solution, which was precipitated with acetone and collected after centrifugation to obtain the ZnO nanoparticles.

(2) The above-mentioned ZnO nanoparticles were dissolved and dispersed with an appropriate amount of ethanol to prepare a ZnO nanoparticle ethanol solution.

(3) Indium nitrate was added to ethanol to form a solution with a concentration of 0.2M. 30 mL of the above-mentioned ZnO nanoparticle ethanol solution was added, and then an appropriate amount of NaOH was added to adjust the pH to 10. Stirring was performed at room temperature for 2 hours to obtain an $In_2O_3$ shell layer covered ZnO nanoparticle solution. After precipitation, the $In_2O_3$ shell layer covered ZnO nanoparticles were obtained.

(4) The $In_2O_3$ shell layer covered ZnO nanoparticles were dispersed with an appropriate amount of ethanol to obtain an $In_2O_3$ shell layer covered ZnO nanoparticle ethanol solution.

(5) 20 mg of chloroauric acid and 30 mL of the above-mentioned $In_2O_3$ shell layer covered ZnO nanoparticle ethanol solution were added to 20 mL of the mixed solution of oleylamine and octadecene, dispersed by ultrasonic, and stirred at 120° C. for 1 h to obtain a mixed solution. Then, the solution was cooled to room temperature. The solids were collected by centrifugation to prepare the nanomaterial, which was washed with hexane and dispersed with an appropriate amount of ethanol for device preparation.

In embodiment 3 of the present disclosure, zinc acetate dihydrate, tetramethylammonium hydroxide, indium nitrate, and chloroauric acid were taken as examples for a detailed introduction.

(1) Add zinc acetate into DMF to form a solution with a total concentration of 0.5M. 0.6M ethanolic tetramethylammonium hydroxide solution was dropwise added at room temperature. Stirring was continued for 1.5 h to obtain a clear and transparent solution. The ZnO nanoparticles were precipitated with acetone and collected after centrifugation to obtain the ZnO nanoparticles.

(2) The above-mentioned ZnO nanoparticles were dissolved and dispersed with an appropriate amount of ethanol to prepare a ZnO nanoparticle ethanol solution.

(3) Indium nitrate was added to ethanol to form a solution with a concentration of 0.2M. 30 mL of the above-mentioned ZnO nanoparticle ethanol solution was added, and then an appropriate amount of NaOH was added to adjust the pH to 10. Stirring was performed at room temperature for 2 hours to obtain an $In_2O_3$ shell layer covered ZnO nanoparticle solution. After precipitation, the $In_2O_3$ shell layer covered ZnO nanoparticles were obtained.

(4) The $In_2O_3$ shell layer covered ZnO nanoparticles were dispersed with an appropriate amount of ethanol to obtain an $In_2O_3$ shell layer covered ZnO nanoparticle ethanol solution.

(5) 20 mg of chloroauric acid and 30 mL of the above-mentioned $In_2O_3$ shell layer covered ZnO nanoparticle ethanol solution were added to 20 mL of the mixed solution of oleylamine and octadecene, dispersed by ultrasonic, and stirred at 120° C. for 1 h to obtain a mixed solution. The solution was then cooled to room temperature. The solids were collected by centrifugation to prepare the nanomaterial, which was washed with hexane and dispersed with an appropriate amount of ethanol for device preparation.

Embodiments of the present disclosure also provide a light-emitting diode device, which includes an electron transport layer. The material of the electron transport layer may be the nanomaterial or the nanomaterial prepared by the above preparation method. The light-emitting diode device may be a QLED device or an OLED device.

Figure 3:
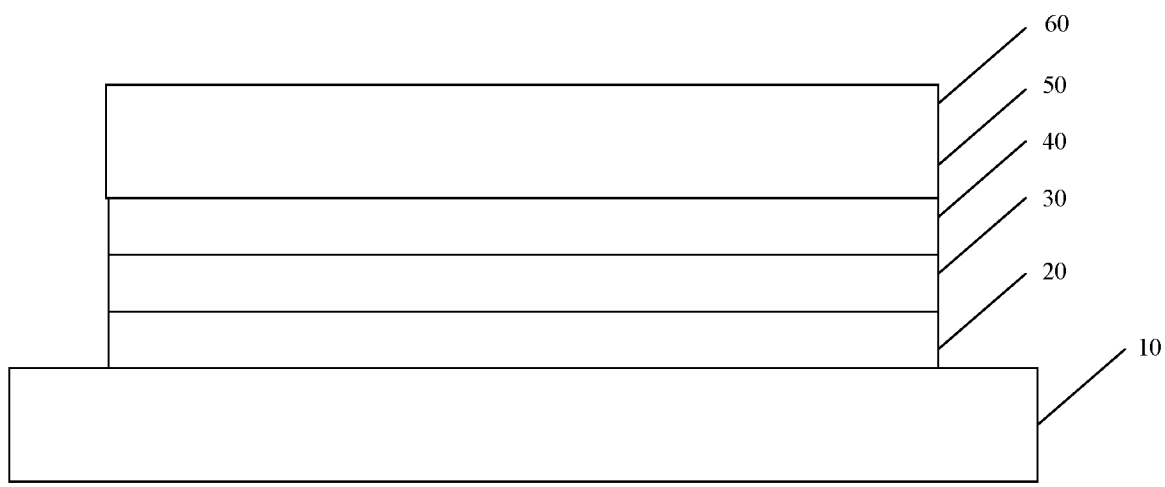
FIG. 3 is a schematic structural diagram of a quantum-dot light-emitting diode (QLED) device according to some embodiments of the present disclosure.

In some embodiments, the light-emitting diode device may be a QLED device as shown in FIG. 3, which includes a substrate 10, an anode 20, a hole transport layer 30, a quantum dot light-emitting layer 40, an electron transport layer 50, and a cathode 60. The material of the electron transport layer 50 is the nanomaterial provided by the present disclosure.

In some embodiments, a preparation method of a QLED device includes the following steps.

At A, the substrate is provided, and an anode is arranged at the substrate.

At B, the hole transport layer is grown on the substrate.

At C, a light-emitting functional layer is deposited on the hole transport layer.

At D, the electron transport layer is deposited on the light-emitting functional layer, and the material of the electron transport layer is the nanomaterial.

At E, the cathode is evaporated on the electron transport layer.

In some embodiments, in order to obtain a high-quality nanomaterial layer, the ITO substrate may need to undergo a preprocessing process. The processing steps may include cleaning an ITO conductive glass with detergent to preliminarily remove stains on the surface, ultrasonically cleaning for 20 minutes in each of deionized water, isopropanol, acetone, and deionized water to remove impurities on the surface, and finally blowing dry with high-purity nitrogen to obtain the ITO anode.

In some embodiments, the preparation steps of the hole transport layer may include placing the ITO substrate on a spinner, spin coating to form a film using the prepared hole transport material solution, controlling the thickness of the film by adjusting the concentration of the solution, a spin coating speed, and spin coating time, and then performing thermal annealing at an appropriate temperature.

The hole transport layer described in the present disclosure can be made of a conventional hole transport material, including but not limited to Poly(9,9-dioctylfluorene-CO—N-(4-butylphenyl)diphenylamine) (TFB), polyvinylcarbazole (PVK), Poly(N,N'bis(4-butylphenyl)-N,N'-bis(phenyl)benzidine) (Poly-TPD), 4,4',4"-Tris(carbazol-9-yl)triphenylamine (TCTA), Poly(3,4-ethylenedioxythiophene)-poly(styrenesulfonic acid) (PEDOT:PSS), 4,4'-bis(9-carbazole)biphenyl (CBP), or a mixture of any combination thereof, and can be another high performance hole transport material.

The concentration of the hole transport material solution may be 10 mg/mL, the spin coating speed may be 4.5 k rpm/min, and the spin coating time may be 30 s.

In some embodiments, the preparation steps of the quantum dot light-emitting layer may include placing the substrate on which the hole transport layer has been spin-coated on the spinner, spin coating to form the film using the prepared light-emitting material solution with a certain concentration, controlling the thickness of the light-emitting layer by adjusting the solution concentration, spin coating speed, and spin coating time, and drying at an appropriate temperature.

A quantum dot of the quantum dot light-emitting layer may include any one of red, green, and blue quantum dots. The quantum dot may include but is not limited to at least one of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, or various core-shell structure quantum dots.

The thickness of the quantum dot light-emitting layer may range from 20 to 60 nm.

The concentration of the light-emitting material solution may be 20 mg/mL, the spin coating speed may be 4 k rpm/min, and the spin coating time may be 30 s.

In some embodiments, the preparation step of the electron transport layer may include placing the substrate on which the quantum dot light-emitting layer has been spin-coated on the spinner, spin-coating to form a film using the prepared nanomaterial solution with a certain concentration, controlling the thickness of the electron transport layer by adjusting the concentration of the solution, spin coating speed, and spin coating time, and then performing annealing to form the film.

The thickness of the electron transport layer may range from 20 to 60 nm.

The concentration of the electron transport layer material solution may be 30 mg/mL, the spin coating speed may be 4 k rpm/min, and the spin coating time may be 30 s.

In some embodiments, the preparation step of the cathode may include placing the substrate on which the functional layers have been deposited into an evaporation chamber, and thermally vapor-depositing a layer of 30 to 80 nm metal silver or aluminum as a cathode through a mask.

In some embodiments, packaging processing may be performed on the obtained QLED device. The packaging processing may be performed by a common machine or manually.

In a packaging processing environment, oxygen content and water content may be both lower than 0.1 ppm to ensure the stability of the device.

A QLED device of the present disclosure is further explained in the following embodiments.

In embodiment 4 of the present disclosure, the material of the substrate 10 was a glass sheet, the material of the anode 20 was the ITO substrate, the material of the hole transport layer 30 was TFB, the material of the electron transport layer 50 was the nanomaterial prepared in embodiment 1, and the material of the cathode 60 was Al.

In embodiment 5 of the present disclosure, the material of the substrate 10 was the glass sheet, the material of the anode 20 was the ITO substrate, the material of the hole transport layer 30 was TFB, the material of the electron transport layer 50 was the nanomaterial prepared in embodiment 2, and the material of the cathode 60 was Al.

In embodiment 6 of the present disclosure, the material of the substrate 10 was the glass sheet, the material of the anode 20 was the ITO substrate, the material of the hole transport layer 30 was TFB, the material of the electron transport layer 50 was the nanomaterial prepared in embodiment 3, and the material of the cathode 60 was Al.

The present disclosure also provided a comparison embodiment, wherein the material of the substrate 10 was the glass sheet, the material of the anode 20 was the ITO substrate, the material of the hole transport layer 30 was TFB, the material of the electron transport layer 50 was the ZnO nanoparticle, and the material of the cathode 60 was Al.

The QLEDs prepared in embodiment 4, embodiment 5, embodiment 6, and comparison embodiment were tested for performance, and light-emitting efficiency and stability were measured as follows.

|  | Turn-on Voltage (V) | Light-emitting Efficiency (External Quantum Efficiency, EQE) (%) |
| --- | --- | --- |
| Comparison Embodiment | 5.33 | 2.49 |
| Embodiment 4 | 2.54 | 6.33 |
| Embodiment 5 | 3.07 | 5.60 |
| Embodiment 6 | 3.24 | 5.31 |

Compared with the comparison embodiment, the light-emitting efficiencies of embodiment 4, embodiment 5, and embodiment 6 were significantly improved, and meanwhile, the stabilities of the diodes were improved to a certain degree.

In summary, with the nanomaterial of the present disclosure, by coating the $In_2O_3$ layer on the surface of ZnO and using $In_2O_3$ as a shell layer to cover the semiconductor ZnO nanoparticle with a relatively narrow bandgap, the holes may be effectively blocked from being transferred from the light-emitting layer to the electron transport layer, the surface defects of ZnO may be passivated, capturing of the electrons by the defects may be reduced, and the electron-hole recombination efficiency may be improved. Meanwhile, the conductive component of Au atoms or Au microclusters may be introduced and loaded on the surface of the $In_2O_3$ shell layer to form isolated Au single atoms and Au microclusters.

The Au atom with the atomic-level dispersion may have a large specific surface area and interact with the neighboring coordinated In atom, which causes the redistribution of the charges around the In atom to build the new electron transport path to accelerate the electron transport and improve the electron transport properties of the device to cooperatively improve the electron transport properties and stability of the device.

It should be understood that the application of the present disclosure is not limited to the above examples, those of ordinary skill in the art can make improvements or modifications according to the above descriptions. All such improvements and modifications should fall within the protection scope of the appended claims of the present disclosure.

What is claimed is:

1. A preparation method of a nanomaterial comprising:
    providing a ZnO nanoparticle;
    depositing an $In_2O_3$ shell layer on a surface of the ZnO nanoparticle; and
    after depositing the $In_2O_3$ shell layer on the surface of the ZnO nanoparticle, loading Au atoms and/or Au microclusters on the $In_2O_3$ shell layer to prepare the nanomaterial.

2. The preparation method of the nanomaterial according to claim 1, wherein preparing the ZnO nanoparticle comprises:
    dissolving a zinc salt in an organic solvent to obtain a zinc salt solution;
    adding an alkali solution to the zinc salt solution to obtain a ZnO nanoparticle solution; and
    performing precipitation and drying on the ZnO nanoparticle solution to prepare the ZnO nanoparticle.

3. The preparation method of the nanomaterial according to claim 2, wherein depositing the $In_2O_3$ shell layer on the surface of the ZnO nanoparticle comprises:
    dissolving an indium salt in an organic solvent to obtain an indium salt solution;
    dissolving the ZnO nanoparticle in organic alcohol to obtain a ZnO nanoparticle alcohol solution;
    adding the ZnO nanoparticle alcohol solution to the indium salt solution and then adding the alkali solution to mix to react to obtain an $In_2O_3$ shell layer covered ZnO nanoparticle solution; and
    performing precipitation and drying on the $In_2O_3$ shell layer covered ZnO nanoparticle solution to obtain an $In_2O_3$ shell layer covered ZnO nanoparticle.

4. The preparation method of the nanomaterial according to claim 3, wherein loading the Au atoms and/or Au microclusters on the $In_2O_3$ shell layer to prepare the nanomaterial comprises:
    dissolving the $In_2O_3$ shell layer covered ZnO nanoparticle in organic alcohol to obtain an $In_2O_3$ shell layer covered ZnO nanoparticle alcohol solution; and
    adding a gold salt and the $In_2O_3$ shell layer covered ZnO nanoparticle alcohol solution to a mixed solution composed of oleylamine and octadecene, and performing mixing at 80 to 150° C., to load the Au atoms and/or Au microclusters on the $In_2O_3$ shell layer to prepare the nanomaterial.

5. The preparation method of the nanomaterial according to claim 4, wherein:
    the gold salt comprises one or more of chloroauric acid, ammonium tetrachloroaurate hydrate, and (triphenylphosphine) gold chloride
    the indium salt comprises one or more of indium nitrate, indium chloride, and indium acetate;
    the zinc salt comprises one or more of zinc chloride, zinc nitrate, and zinc acetate;
    the organic solvent comprises one or both dimethyl formamide (DMF) and dimethyl sulfoxide (DMSO); or
    the alkali solution comprises one or more of sodium hydroxide, potassium hydroxide, tetramethylammonium hydroxide, and ammonia.

6. The preparation method of the nanomaterial according to claim 5, wherein the organic alcohol comprises at least one of methanol, ethanol, or ethylene glycol.

7. The preparation method of the nanomaterial according to claim 5, wherein:

a concentration of an indium salt solution ranges from 0.1 to 0.3 M; and in the preparation method, pH of a reaction condition is maintained at 8 to 10.

8. A preparation method of a light-emitting diode comprising:

preparing an electron transport layer on a cathode, a material of the electron transport layer being a nanomaterial, and the nanomaterial including a ZnO nanoparticle, an $In_2O_3$ shell layer covering a surface of the ZnO nanoparticle, and Au atoms and/or Au microclusters loaded on the $In_2O_3$ shell layer;

preparing a light-emitting layer on the electron transport layer; and preparing an anode on the light-emitting layer to prepare the light-emitting diode; or the preparation method of the light-emitting diode comprising:

preparing the light-emitting layer on the anode;

preparing the electron transport layer on the light-emitting layer, the material of the electron transport layer being the nanomaterial, and the nanomaterial including the ZnO nanoparticle, the $In_2O_3$ shell layer covering the surface of the ZnO nanoparticle, and the Au atoms and/or the Au microclusters loaded on the $In_2O_3$ shell layer; and preparing the cathode on the electron transport layer to prepare the light-emitting diode.

9. A nanomaterial comprising:

a ZnO nanoparticle;

an $In_2O_3$ shell layer covering a surface of the ZnO nanoparticle; and

Au atoms and/or Au microclusters loaded on the $In_2O_3$ shell layer.

10. A light-emitting diode device comprising:

a cathode;

an anode;

a light-emitting layer arranged between the cathode and the anode; and an electron transport layer arranged between the cathode and the light-emitting layer;

wherein a material of the electron transport layer is a nanomaterial comprising a ZnO nanoparticle, an $In_2O_3$ shell layer covering a surface of the ZnO nanoparticle, and Au atoms and/or Au microclusters loaded on the $In_2O_3$ shell layer.

11. The light emitting diode device according to claim 10, wherein the light-emitting layer is a quantum dot light-emitting layer, a quantum dot of the quantum dot light-emitting layer comprises any one of red, green, and blue quantum dots, and the quantum dot comprises at least one of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, or CuInSe.

12. The light emitting diode device of claim 11, wherein:

a thickness of the quantum dot light-emitting layer ranges from 20 to 60 nm; and a thickness of the electron transport layer ranges from 20 to 60 nm.

13. The preparation method of the light-emitting diode according to claim 8, wherein the nanomaterial is prepared by:

providing the ZnO nanoparticle;

depositing the $In_2O_3$ shell layer on the surface of the ZnO nanoparticle; and loading the Au atoms and/or the Au microclusters on the $In_2O_3$ shell layer.

14. The preparation method of the light-emitting diode according to claim 13, wherein preparing the ZnO nanoparticle comprises:

dissolving a zinc salt in an organic solvent to obtain a zinc salt solution;

adding an alkali solution to the zinc salt solution to obtain a ZnO nanoparticle solution; and performing precipitation and drying on the ZnO nanoparticle solution to prepare the ZnO nanoparticle.

15. The preparation method of the light-emitting diode according to claim 14, wherein depositing the $In_2O_3$ shell layer on the surface of the ZnO nanoparticle comprises:

dissolving an indium salt in an organic solvent to obtain an indium salt solution;

dissolving the ZnO nanoparticle in organic alcohol to obtain a ZnO nanoparticle alcohol solution;

adding the ZnO nanoparticle alcohol solution to the indium salt solution and then adding the alkali solution to mix to react to obtain an $In_2O_3$ shell layer covered ZnO nanoparticle solution; and performing precipitation and drying on the $In_2O_3$ shell layer covered ZnO nanoparticle solution to obtain an $In_2O_3$ shell layer covered ZnO nanoparticle.

16. The preparation method of the light-emitting diode according to claim 15, wherein loading the Au atoms and/or Au microclusters on the $In_2O_3$ shell layer to prepare the nanomaterial comprises:

dissolving the $In_2O_3$ shell layer covered ZnO nanoparticle in organic alcohol to obtain an $In_2O_3$ shell layer covered ZnO nanoparticle alcohol solution; and adding a gold salt and the $In_2O_3$ shell layer covered ZnO nanoparticle alcohol solution to a mixed solution composed of oleylamine and octadecene, and performing mixing at 80 to 150° C., to load the Au atoms and/or Au microclusters on the $In_2O_3$ shell layer to prepare the nanomaterial.

17. The preparation method of the light-emitting diode according to claim 16, wherein:

the gold salt comprises one or more of chloroauric acid, ammonium tetrachloroaurate hydrate, and (triphenylphosphine) gold chloride;

the indium salt comprises one or more of indium nitrate, indium chloride, and indium acetate;

the zinc salt comprises one or more of zinc chloride, zinc nitrate, and zinc acetate;

the described organic solvent comprises one or both dimethyl formamide (DMF) and dimethyl sulfoxide (DMSO); or the described alkali solution comprises one or more of sodium hydroxide, potassium hydroxide, tetramethylammonium hydroxide, and ammonia.

18. The preparation method of the light-emitting diode according to claim 17, wherein:

the organic alcohol comprises at least one of methanol, ethanol, or ethylene glycol;

a concentration of an indium salt solution ranges from 0.1 to 0.3 M; and in the preparation method, pH of a reaction condition is maintained at 8 to 10.

* * * * *